United States Patent [19]
Nakashima et al.

[11] Patent Number: 5,519,231
[45] Date of Patent: May 21, 1996

[54] PRESSURE-CONNECTION TYPE SEMICONDUCTOR DEVICE HAVING A THERMAL COMPENSATOR IN CONTACT WITH A SEMICONDUCTOR BASE SUBSTRATE IN AN ALLOY-FREE STATE

[75] Inventors: Nobuhisa Nakashima; Tokumitsu Sakamoto; Yuzuru Konishi, all of Fukuoka, Japan

[73] Assignee: Mitsubishi Denki Kabushiki Kaisha, Tokyo, Japan

[21] Appl. No.: 340,382

[22] Filed: Nov. 15, 1994

[30] Foreign Application Priority Data

Nov. 29, 1993 [JP] Japan .................................. 5-298095

[51] Int. Cl.⁶ .................................................. H01L 23/42
[52] U.S. Cl. .................................... 257/181; 257/688
[58] Field of Search ........................... 257/177, 181, 257/688, 792, 785, 786, 727; 361/117, 118, 388, 389, 709, 712, 691, 717

[56] References Cited

U.S. PATENT DOCUMENTS 3,800,192 3/1974 Eisele et al. .
4,829,364 5/1989 Ohdate .
5,371,386 12/1994 Tokunoh et al. .......................... 257/181

FOREIGN PATENT DOCUMENTS 1257780 12/1971 United Kingdom .

*Primary Examiner*—Rolf Hille
*Assistant Examiner*—Minhloan Tran
*Attorney, Agent, or Firm*—Oblon, Spivak, McClelland, Maier, & Neustadt

[57] ABSTRACT

In order to obtain a pressure-connection type semiconductor device while preventing misregistration of a semiconductor base substrate and a thermal compensator with no penetration of an insulating/holding material and a method suitable for fabricating this device, concentric first and second steps (31c, 31a) are provided on an upper major surface of a first thermal compensator (31) from its outer periphery toward the center. A corner groove (3b) is provided along the overall periphery of an inner corner of the first step (31c), in the form of a ring. Since no insulating/holding material is provided in a contact surface between the semiconductor the substrate and the thermal compensator, the semiconductor base substrate and the thermal compensator are maintained in excellent electrical contact while no local stress is applied to the semiconductor substrate when the same is brought into pressure contact with the thermal compensator.

2 Claims, 8 Drawing Sheets

PRESSURE-CONNECTION TYPE SEMICONDUCTOR DEVICE HAVING A THERMAL COMPENSATOR IN CONTACT WITH A SEMICONDUCTOR BASE SUBSTRATE IN AN ALLOY-FREE STATE

BACKGROUND OF THE INVENTION

1. Field of the Invention

The present invention relates to a pressure-connection type semiconductor device and a method of fabricating the same, and more particularly, it relates to a pressure-connection type semiconductor device in which a thermal compensator and a semiconductor base substrate are in contact with each other in an alloy-free state, and a method of fabricating the same.

2. Background of the Invention

In a well-known type of conventional pressure-connection type semiconductor device, a semiconductor base substrate is incorporated in the device in an alloy-free state, i.e., with no blazing.

FIG. 9 is a sectional view showing a power gate turnoff thyristor (hereinafter referred to as "GTO") which is formed as a conventional alloy-free pressure-connection type semiconductor device. In the pressure-connection type semiconductor device shown in FIG. 9, a cathode layer 2K, an anode layer 2A and a gate electrode layer 2G are formed on upper and lower surfaces and a central portion of the upper major surface of a semiconductor substrate 1 respectively, thereby defining a semiconductor base substrate 100.

Further, first and second discoidal thermal compensators 3 and 6 are provided in contact with surfaces of the anode and cathode layers 2A and 2K respectively, while anode and cathode copper blocks 7 and 8 are provided to be in contact with surfaces of the first and second thermal compensators 3 and 6 in an alloy-free state respectively.

This substrate is stored in a cylindrical ceramic casing 9, so that base portions of the anode and cathode copper blocks 7 and 8 are coupled to the casing 9 through metal flanges 10a and 10b respectively.

A through hole 6H is provided in a central portion of the second thermal compensator 6 provided on the gate electrode layer 2G while a non-through hole 8H is provided in the cathode copper block 8 in correspondence thereto, so that a gate electrode holder 11 is slidably inserted in an insertion hole which is defined by the through hole 6H and the non-through hole 8H. A gate electrode 12 is connected to an end of an L-shaped lead wire 10 which is drawn out toward the exterior of the casing 9.

FIG. 10 is an enlarged view showing a portion around the semiconductor base substrate 100. Referring to FIG. 10, polyimide varnish 1a is applied to an outer peripheral edge of the semiconductor substrate 1, in order to insulate and protect a p-n junction part which is exposed on this outer peripheral edge. An insulating/holding material 4 is formed on the semiconductor substrate 1 to cover surfaces of the polyimide varnish 1a and the overall step portion of the first thermal compensator 3 for preventing creeping discharge along the outer peripheral edge of the semiconductor substrate 1 and protecting the same, and fixed to the first thermal compensator 3. The insulating/holding material 4 is formed by applying viscose liquid resin onto the surfaces of the polyimide varnish 12a and the overall step portion of the first thermal compensator 3 while placing the semiconductor base substrate 100 on the first thermal compensator 3, and hardening the resin. This insulating/holding material 4 adheres to the first thermal compensator 3, thereby preventing misregistration of the semiconductor base substrate 100 and the first thermal compensator 3.

In employment in a prescribed apparatus, the pressure-connection type semiconductor device is inserted between an anode member 20A and a cathode member 20K which are provided on the prescribed apparatus as shown in FIG. 9. The anode and cathode members 20A and 20K are urged by external springs (not shown) along arrows respectively, so that the lower surface of the cathode member 20K is in pressure contact with the upper surface of the cathode copper block 8 while the upper surface of the anode member 20A is in pressure contact with the lower surface of the anode copper block 7. Thus, the cathode member 20K is reliably electrically connected with the cathode layer 2K through the cathode copper block 8 and the thermal compensator 6.

In the conventional pressure-connection type semiconductor device having the aforementioned structure, the viscose liquid resin which is applied to the surfaces of the polyimide varnish 1a covering the outer peripheral edge of the semiconductor base substrate 100 and the overall step portion of the first thermal compensator 3 for forming the insulating/holding material 4 may penetrate into a clearance between the semiconductor base substrate 100 and the first thermal compensator 3 by a capillary phenomenon. In a state illustrated in FIG. 11, which is a partially enlarged view showing the outer peripheral edge of the semiconductor base substrate 100, the insulating/holding material 4 penetrates into a clearance between the cathode layer 2A provided on the lower major surface of the semiconductor base substrate 100 and the first thermal compensator 3, to form a flash 4a.

In such a state, electrical contact between the semiconductor base substrate 100 and the first thermal compensator 3 is rendered so imperfect that electric characteristics are deteriorated in a short time or local stress is concentrated on the semiconductor base substrate 100 when force is applied from the exterior for pressure connection, and hence the semiconductor base substrate 100 itself may be broken as the case may be, leading to yield reduction in fabrication of the device.

SUMMARY OF THE INVENTION

According to a first aspect of the present invention, a pressure-connection type semiconductor device comprising a semiconductor base substrate, having at least one P-N junction, which is in contact with a thermal compensator having a larger diameter than the semiconductor base substrate in an alloy-free state, is provided with an insulating/holding material for covering an outer peripheral portion of the semiconductor base substrate, and the insulating/holding material is not present in a contact surface between the semiconductor base substrate and the thermal compensator, but fixed to the thermal compensator in the exterior of the contact surface.

Preferably, the thermal compensator is provided with a first step in a direction which is separated from the semiconductor base substrate along the overall periphery of the thermal compensator in the exterior of the contact surface, and the insulating/holding material is engaged with the first step.

Preferably, the insulating/holding material is bonded to the thermal compensator by a bonding layer on a bottom surface of the first step of the thermal compensator, and a corner groove for storing an overflowing portion of the bonding layer is formed in an inner corner of the first step along the overall periphery of the first step.

According to a second aspect of the present invention, a pressure-connection type semiconductor device comprising a semiconductor base substrate, having at least one P-N junction, which is in contact with a thermal compensator having a larger diameter than the semiconductor base substrate in an alloy-free state, is provided with an insulating/holding material for covering an outer peripheral portion of the semiconductor base substrate, and the insulating/holding material is not present in a contact surface between the semiconductor base substrate and the thermal compensator, but engaged with the thermal compensator in the exterior of the contact surface.

Preferably, the thermal compensator is provided with a first step in a direction which is separated from the semiconductor base substrate along the overall periphery of the thermal compensator in the exterior of the contact surface, and the insulating/holding material is engaged with the first step.

According to the first or second aspect of the present invention, a second step defining an outer periphery of the contact surface is preferably formed inside the first step of the thermal compensator.

The present invention is also directed to a method of fabricating a pressure-connection type semiconductor device according to the first or second aspect of the present invention.

According to a third aspect of the present invention, a method of fabricating a pressure-connection type semiconductor device according to the first aspect comprises (a) a step of preparing a forming jig having a ring-shaped forming groove which is responsive to the outer peripheral portion of the semiconductor base substrate, so that at least a surface portion defining the groove consists of resin, (b) a step of placing the semiconductor base substrate on the forming jig for positioning the outer peripheral portion of the semiconductor substrate on the forming groove, (c) a step of filling up the forming groove with viscose resin for covering the overall surface of the outer peripheral portion of the semiconductor base substrate, (d) steps of hardening the viscose resin, thereby obtaining the insulating/holding material covering the outer peripheral portion of the semiconductor base substrate, and removing the semiconductor base substrate which is provided with the insulating/holding member from the forming jig, and (e) a step of moving the semiconductor base substrate onto the thermal compensator for fixing the insulating/holding material to the thermal compensator in the exterior of the contact surface.

According to a fourth aspect of the present invention, a method of fabricating a pressure-connection type semiconductor device according to the second aspect comprises (a) a step of preparing a forming jig having a ring-shaped forming groove which is responsive to the outer peripheral portion of the semiconductor base substrate so that at least a surface portion defining the groove consists of resin, (b) a step of placing the semiconductor base substrate on the forming jig for positioning the outer peripheral portion of the semiconductor base substrate on the forming groove, (c) a step of filling up the forming groove with viscose resin for covering the overall surface of the outer peripheral portion of the semiconductor base substrate, (d) steps of hardening the viscose resin, thereby obtaining the insulating/holding material covering the outer peripheral portion of the semiconductor base substrate, and removing the semiconductor base substrate which is provided with the insulating/holding material from the forming jig, and (e) a step of moving the semiconductor base substrate onto the thermal compensator for engaging the insulating/holding material with the thermal compensator in the exterior of the contact surface.

According to the third or fourth aspect of the present invention, the step (c) is preferably carried out while applying a load in a direction from the semiconductor base substrate toward the forming jig.

According to the third or fourth aspect of the present invention, the forming jig preferably has a base substrate table which is formed by a projection having a larger outer diameter than the contact surface between the semiconductor base substrate and the thermal compensator, and a resin collecting groove is preferably formed in the vicinity of an edge in a surface of the base substrate table.

According to the third or fourth aspect of the present invention, a through hole is preferably formed in the surface of the base substrate table perpendicularly to a major surface of the forming jig.

According to the third or fourth aspect of the present invention, a plurality of through holes are preferably provided so that at least one of the through holes extends from a bottom portion of the resin collecting groove.

According to the third or fourth aspect of the present invention, a step portion having a shape which is responsive to a corner portion of the base substrate table is preferably formed in the insulating/holding material through the step (d), and the step (e) preferably comprises a step of engaging the step portion with the first step of the thermal compensator for performing registration of the semiconductor base substrate and the thermal compensator.

According to the third or fourth aspect of the present invention, an outer one of a pair of groove side surfaces defining the forming groove of the forming jig is preferably inwardly tapered to open toward an opening portion of the forming groove.

According to the third or fourth aspect of the present invention, at least a surface portion of the forming jig is preferably prepared from a material which is different from that for the insulating/holding material.

According to the third or fourth aspect of the present invention, the forming jig is preferably prepared by coating a surface of a metal block with the material.

According to the third or fourth aspect of the present invention, the forming jig is preferably prepared from a block consisting of the material.

According to the third or fourth aspect of the present invention, the insulating/holding material is preferably made of silicone rubber, and the material for the coating is preferably tetrafluororesin.

According to the third or fourth aspect of the present invention, the insulating/holding material is preferably made of silicone rubber, and the material for the coating is preferably PFA (perfluoroalkoxy).

According to the first aspect of the present invention, the insulating/holding material which is provided to cover the outer peripheral portion of the semiconductor base substrate is not present in the contact surface between the semiconductor base substrate and the thermal compensator in the pressure-connection type semiconductor device comprising the semiconductor base substrate which is in contact with the thermal compensator in an alloy-free state, whereby the semiconductor base substrate and the thermal compensator are maintained in excellent electrical contact while it is possible to prevent the semiconductor base substrate from application of local stress in pressure connection with the thermal compensator. The insulating/holding material is fixed to the thermal compensator, thereby preventing misregistration of the semiconductor base substrate and the thermal compensator.

In the pressure-connection type semiconductor device according to the first aspect of the present invention, the thermal compensator has the first step in the exterior of the contact surface between the semiconductor base substrate and the thermal compensator, whereby it is possible to univocally decide positional relation between the semiconductor base substrate and the thermal compensator by engaging the insulating/holding material with the first step.

In the pressure-connection type semiconductor device according to the first aspect of the present invention, the corner groove for storing an overflowing portion of the bonding layer is provided in the inner corner of the first step and the insulating/holding material is bonded to the bottom surface of the first step of the thermal compensator which is separated from the contact surface between the semiconductor base substrate and the thermal compensator by the bonding layer, whereby it is possible to prevent the bonding layer from penetrating into the contact surface between the semiconductor base substrate and the thermal compensator.

According to the second aspect of the present invention, the insulating/holding material which is provided to cover the outer peripheral portion of the semiconductor base substrate is not present in the contact surface between the semiconductor base substrate and the thermal compensator in the pressure-connection type semiconductor device comprising the semiconductor base substrate which is in contact with the thermal compensator in an alloy-free state, whereby the semiconductor base substrate and the thermal compensator are maintained in excellent electrical contact while it is possible to prevent the semiconductor base substrate from application of local stress in pressure connection with the thermal compensator.

According to this mode, further, prevention of misregistration of the semiconductor base substrate and the thermal compensator is attained by engagement of the insulating/holding material and the thermal compensator.

In the pressure-connection type semiconductor device according to the second aspect of the present invention, the thermal compensator has the first step in the exterior of the contact surface between the semiconductor base substrate and the thermal compensator, whereby it is possible to univocally decide positional relation between the semiconductor base substrate and the thermal compensator by engaging the insulating/holding material with the first step.

In the pressure-connection type semiconductor device according to the first or second aspect of the present invention, the second step defining the contact surface between the semiconductor base substrate and the thermal compensator inside the first step stores an unnecessary portion of the insulating/holding material caused in a fabrication process.

In a method according to the third or fourth aspect of the present invention, on the other hand, the semiconductor base substrate and the thermal compensator are coupled with each other after the viscose resin for forming the insulating/holding material is hardened, whereby no unhardened resin flows into the contact surface between the semiconductor base substrate and the thermal compensator and it is possible to readily fabricate the pressure-connection type semiconductor device according to the first or second aspect of the present invention.

In the method according to the third or fourth aspect of the present invention, it is possible to particularly effectively prevent misregistration of the semiconductor base substrate and the forming jig in the step of filling up the ring-shaped forming groove of the forming jig with the viscose resin.

In the method according to the third or fourth aspect of the present invention, part of the viscose resin, which is filled up in the forming groove when the semiconductor base substrate is placed on the substrate table, penetrating into the contact surface between the semiconductor base substrate and the base substrate table is stored in the resin collecting groove so that the range of penetration is limited.

In the method according to the third or fourth aspect of the present invention, the through hole is provided perpendicularly to the major surface of the forming jig, whereby a gas remaining in the contact surface between the semiconductor base substrate and the base substrate table is discharged.

In the method according to the third or fourth aspect of the present invention, at least one of the plurality of through holes extends from the bottom portion of the resin collecting groove, thereby contributing to discharge of excess part of the resin as well as to discharge of the gas remaining in the contact surface between the semiconductor base substrate and the base substrate table.

In the method according to the third or fourth aspect of the present invention, the step portion of the insulating/holding material which is formed in response to the corner portion of the base substrate table is engaged with the first step of the thermal compensate for performing registration of the semiconductor base substrate and the thermal compensator, whereby the registration is simplified.

In the method according to the third or fourth aspect of the present invention, the outer one of the pair of groove side surfaces defining the forming groove of the forming jig is inwardly tapered to open toward the opening portion of the forming groove, whereby a step of removing the semiconductor base substrate from the forming jig after formation of the insulating/holding material is simplified.

In the method according to the third or fourth aspect of the present invention, excellent releasability is attained when the semiconductor base substrate provided with the insulating/holding material is removed from the forming jig.

In the method according to the third or fourth aspect of the present invention, two preferable modes of the forming jig are provided.

In the method according to the third or fourth aspect of the present invention, it is possible to attain particularly excellent releasability by employing tetrafluororesin or PFA as the material for the forming jig when the insulating/holding material is made of silicone rubber.

Accordingly, an object of the present invention is to obtain a pressure-connection type semiconductor device which can prevent misregistration of a semiconductor base substrate and a thermal compensator with no penetration of an insulating/holding material, and a method suitable for fabricating the semiconductor device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

<A. First Embodiment>

<A-1. Overall Structure of Device>

Figure 1:
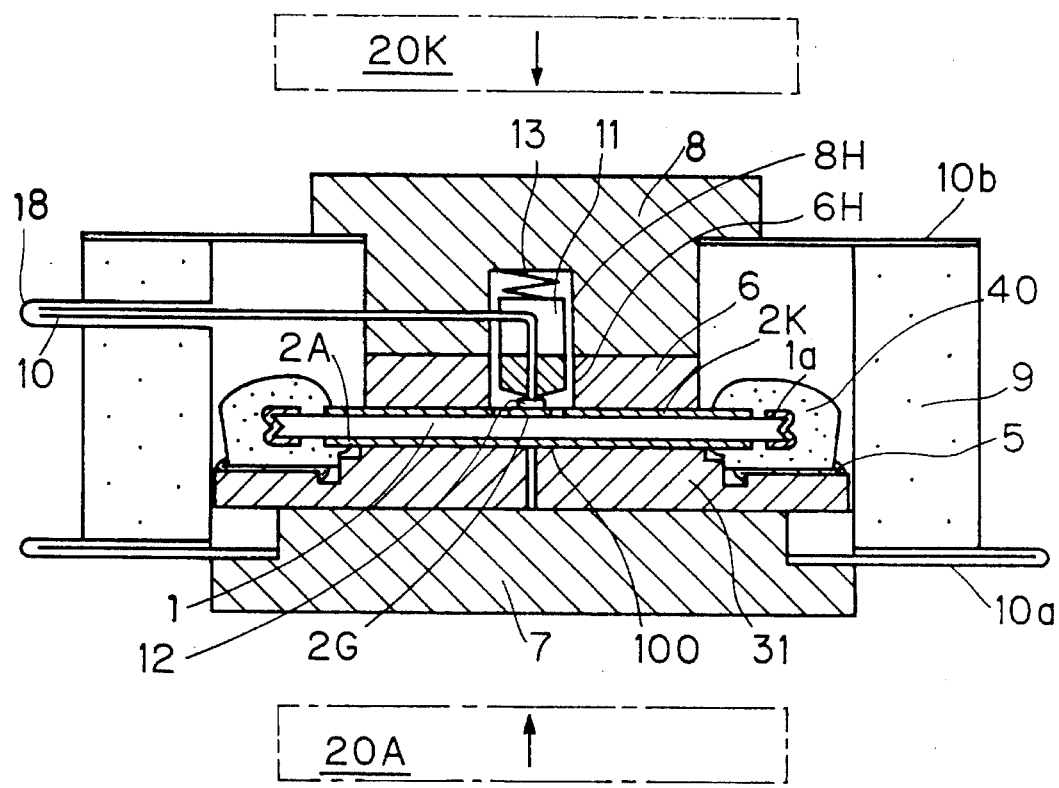
FIG. 1 is a sectional view showing a pressure-connection type semiconductor device according to a first embodiment of the present invention.

FIG. 1 is a sectional view showing an alloy-free pressure-connection type power GTO according to a first embodiment of the inventive pressure-connection type semiconductor device. Referring to FIG. 1, a semiconductor base substrate 100, having a discoidal semiconductor substrate 1 (silicon substrate), is provided with a well-known semiconductor multilayer structure which is required for forming the GTO in the interior of the semiconductor substrate 1. While this embodiment is applied to a GTO, the present invention is applicable to any semiconductor base substrate regardless of its internal structure, so far as the same has at least one p-n junction, in general.

An anode layer 2A is formed on a lower major surface of the semiconductor substrate 1. A gate electrode layer 2G is formed on a central portion of an upper major surface of the semiconductor substrate 1, while a cathode layer 2K is formed on its peripheral region. All these electrode layers are formed by depositing aluminum (A1).

A first discoidal thermal compensator (anodic thermal compensator) 31 and a second discoidal thermal compensator (cathodic thermal compensator) 6 are provided in contact with surfaces of the anode layer 2A and the cathode layer 2K respectively. The first thermal compensator 31 has a diameter which is larger than that of the semiconductor base substrate 100 and slightly smaller than the inner diameter of a cylindrical casing 9 which is made of ceramic. The semiconductor base substrate 100 is not coupled with the first and second thermal compensators 31 and 6 by brazing or the like, but in contact therewith in an alloy-free state.

A surface of a body portion of the first thermal compensator 31 is entirely covered with a thin-film layer (not shown) consisting of aluminum, silver, nickel or gold which is formed by a method such as metal deposition or plating. This thin-film layer maintains the first thermal compensator 31 in excellent electrical and thermal contact with the anode layer 2A and an anode copper block 7. The second thermal compensator 6 also has a similar thin-film layer.

Figure 9:
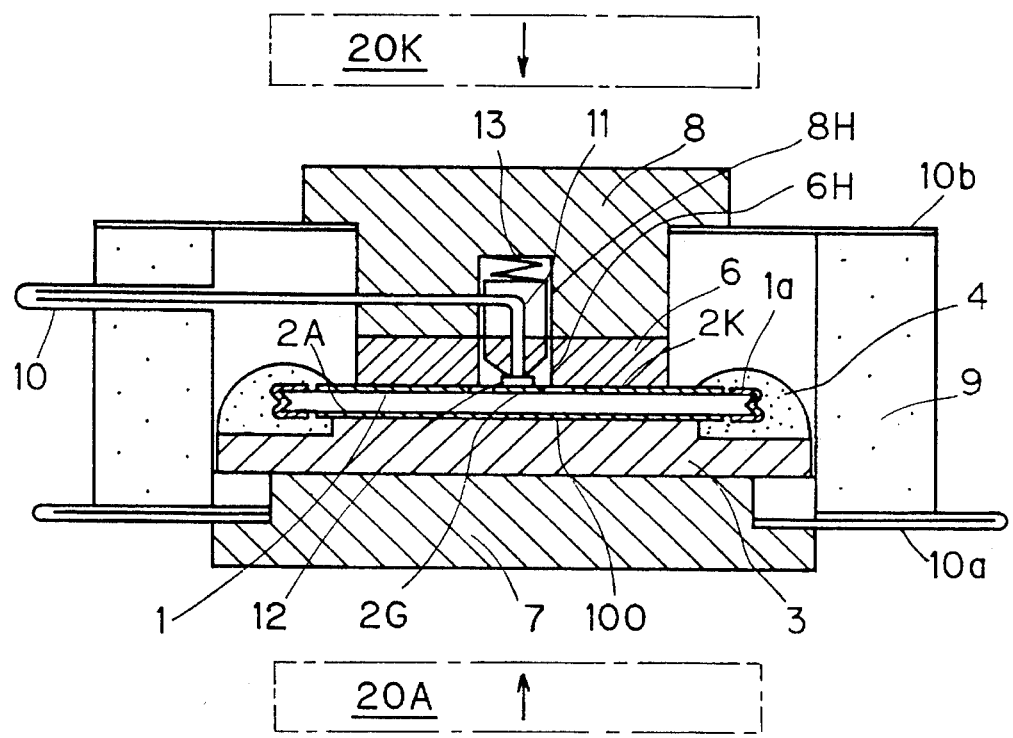
FIG. 9 is a sectional view showing a conventional pressure-connection type semiconductor device.
Figure 10:
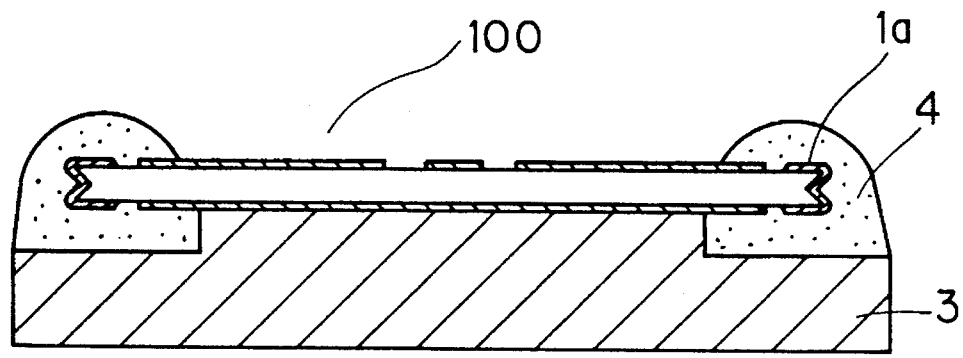
FIG. 10 is a partially enlarged view showing the conventional pressure-connection type semiconductor device.
Figure 11:
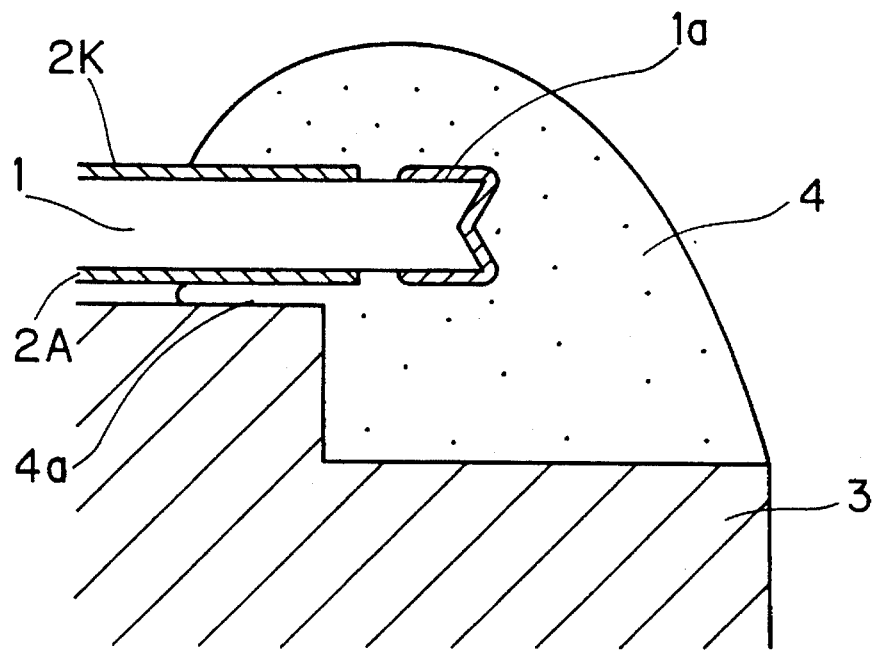
FIG. 11. is a partially enlarged view showing the conventional pressure-connection type semiconductor device.

This semiconductor device is further provided with a cathode copper block 8 and flanges 10a and 10b, in addition to the anode copper block 7. These elements are identical to those of the prior art shown in FIG. 9, and hence redundant description is omitted.

An internal space which is defined by the casing 9 and the flanges 10a and 10b is filled up with inert gas such as gaseous nitrogen. This inert gas is adapted to prevent oxidation, deterioration etc. of the semiconductor base substrate 100, the first and second thermal compensators 31 and 6 etc., which are stored in the internal space.

A gate electrode holder 11 which is slidably inserted in an insertion hole defined by a through hole 6H and a non-through hole 8H and urged by a spring 13 is drawn out toward the exterior of the casing 9 through a lead wire 10, and the semiconductor device is inserted between an anode member 20A and a cathode member 20K in a desired power apparatus and urged along arrows to be employed in a pressure-connection state, also similarly to the prior art.

The feature of the semiconductor device according to this embodiment reside in a structure around a contact portion between the first thermal compensator 31 and the semiconductor base substrate 100 and that of an insulating/holding material 40 covering an outer peripheral portion of the semiconductor base substrate 100, as described later in detail.

<A-2. Detailed Structure of Periphery of Semiconductor Base Substrate 100>

Figure 2:
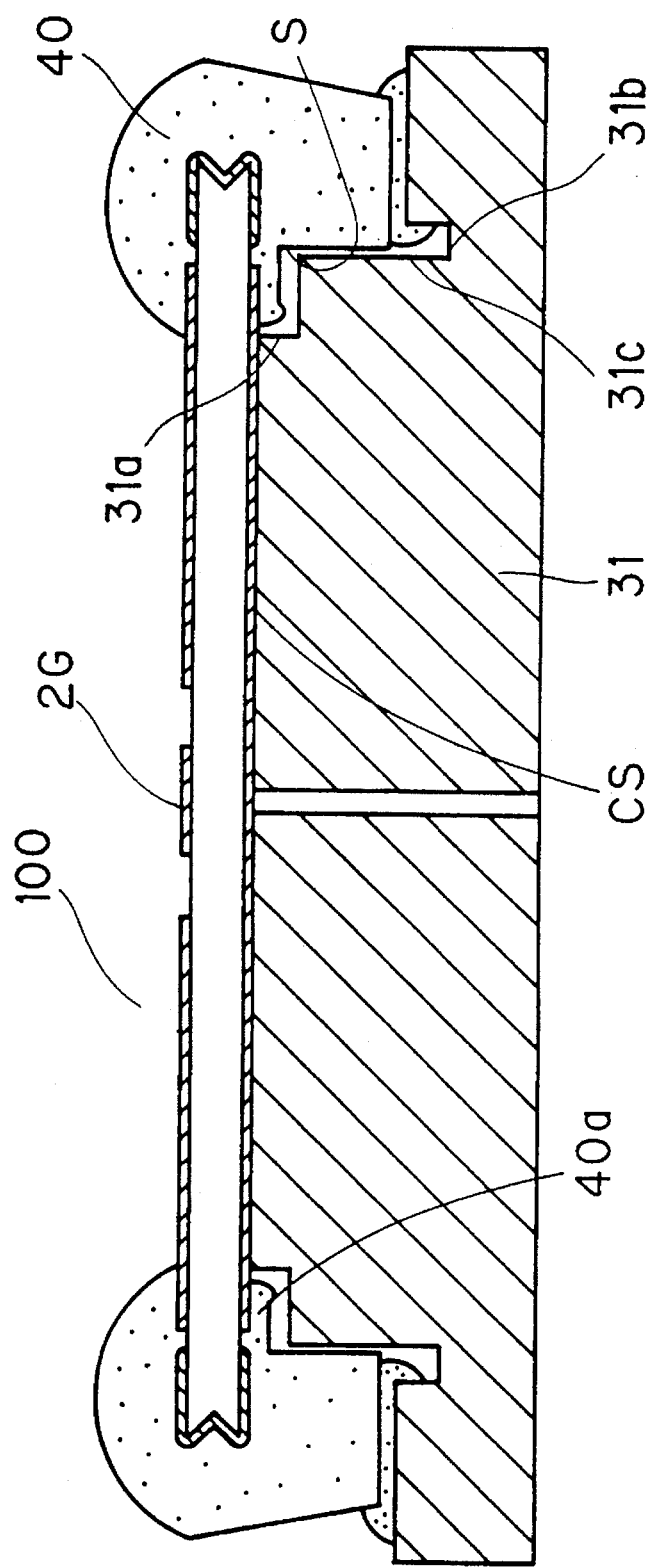
FIG. 2 is a partially enlarged view showing the pressure-connection type semiconductor device according to the first embodiment of the present invention.

FIG. 2 is an enlarged view showing the periphery of the semiconductor base substrate 100 appearing in FIG. 1. The semiconductor base substrate 100 and the first thermal compensator 31 arc arranged in such positions central axes thereof coincide with each other. Concentric first and second steps 31c and 31a are successively provided on an upper major surface of the first thermal compensator 31, from its outer periphery toward the central portion. The second step 31a defines the outer diameter of a contact surface CS between the semiconductor substrate 100 and the first thermal compensator 31 when the semiconductor base substrate 100 is arranged on a prescribed position of the upper major surface of the first thermal compensator 31. The second step 31a has a head of 0.3 to 0.5 mm, for example, while the distance between the first and second steps 31c and 31a, i.e., the horizontal width of the head, is 1.0 to 1.5 mm.

The first step 31c following the second step 31a has a head (toward an opening surface of a corner groove 31b described later) of 0.7 to 1.2 mm, for example. The corner groove 31b of 1.00 mm in depth and 1.0 mm in width, for example, is provided along the overall periphery of an inner corner of the first step 31c, in the form of a ring.

The semiconductor base substrate 100 is coated on its outer peripheral edge with polyimide varnish 1a, which is an insulating material. The polyimide varnish 1a insulates and protects a p-n junction part which is exposed on the outer peripheral edge. In the vicinity of the outer peripheral edge of the semiconductor base substrate 100, further, an insulating/holding material 40 is formed by a material which is excellent in electric insulation, adhesion and heat resistance such as silicone rubber, for example, to cover surfaces of the polyimide varnish 1a. The insulating/holding material 40 is adapted to prevent creeping discharge along the outer peripheral edge of the semiconductor base substrate 100, as well as to protect the outer peripheral edge of the semiconductor base substrate 100 for positioning and fixing the semiconductor base substrate 100 on and to the first thermal compensator 31. This insulating/holding material 40 covers the outer peripheral edge of the semiconductor base substrate 100 with a thickness exceeding a constant value.

The insulating/holding material 40 has a step portion S. A vertical side wall 40c of this step portion S is engaged with a vertical wall of the first step 31c of the first thermal compensator 31. A flash 40a, corresponding to an upper wall part of the step portion S, which is present in a space defined between the semiconductor base substrate 100 and the second step portion 31a is separated from the contact surface CS between the semiconductor base substrate 100 and the first thermal compensator 31. Further, the insulating/holding material 40 is not in contact with a bottom surface of the first step 31c, while the same is engaged with but not fixed to the vertical wall of the first step 31c, as described above.

The insulating/holding material 40 is bonded to and thereby fixed to the first thermal compensator 31 by a bonding insulating/holding material 5 of silicone rubber, for example, which is provided on the bottom surface of the first step 31c. The aforementioned structure of the insulating/holding material 40 can be readily obtained through fabrication steps described later.

<A-3. Characteristic Function/Effect of First Embodiment>

The pressure-connection type semiconductor device having the aforementioned structure attains the following characteristic function/effect:

First, electrical/thermal contact between the semiconductor base substrate 100 and the first thermal compensator 31 is not reduced in a state of employment of this pressure-connection type semiconductor device, due to the insulating/holding material 40 not reaching the contact surface CS between the semiconductor base substrate 100 and the first thermal compensator 31. Further, the semiconductor base substrate 100 is not broken upon application of external force.

Since the flash 40a is not in contact with the first thermal compensator 31, it is possible to prevent the semiconductor base substrate 100 from breakage caused by the flash 40a being held between the semiconductor base substrate 100 and the first thermal compensator 31 upon application of force from the semiconductor base substrate 100 toward the first thermal compensator 31.

Misregistration of the semiconductor base substrate 100 and the first thermal compensator 31 is prevented by both of engagement between the first step 31c and the insulating/holding material 40, and the bonding insulating/holding material 5. While it is preferable to use both of the misregistration preventing functions, only one of these functions may be employable. Namely, the bonding insulating/holding material 5 may be omitted, or the first step 31c may not be engaged with the insulating/holding material 40. The former is described later in detail.

Adhesive strength in hardening of the insulating/holding material 40 with respect to the first thermal compensator 31 is not employed for preventing misregistration of the semiconductor base substrate 100 and the first thermal compensator 31. Therefore, it is possible to previously form the insulating/holding material 40 on the semiconductor base substrate 100 and harden the same before coupling the semiconductor base substrate 100 with the first thermal compensator 31, in correspondence to the fabrication method described later. Thus, it is possible to form the insulating/holding material 40 on the semiconductor base substrate 100 which is in a state still separated from the first thermal compensator 31, thereby improving workability.

<A-4. Method of Fabricating Device according to First Embodiments>

FIGS. 3 to 7 illustrate steps of fabricating the pressure-connection type semiconductor device shown in FIG. 1, with attention drawn to portions which are related to assembling of the semiconductor substrate 1 and the first thermal compensator 31.

Figure 3:
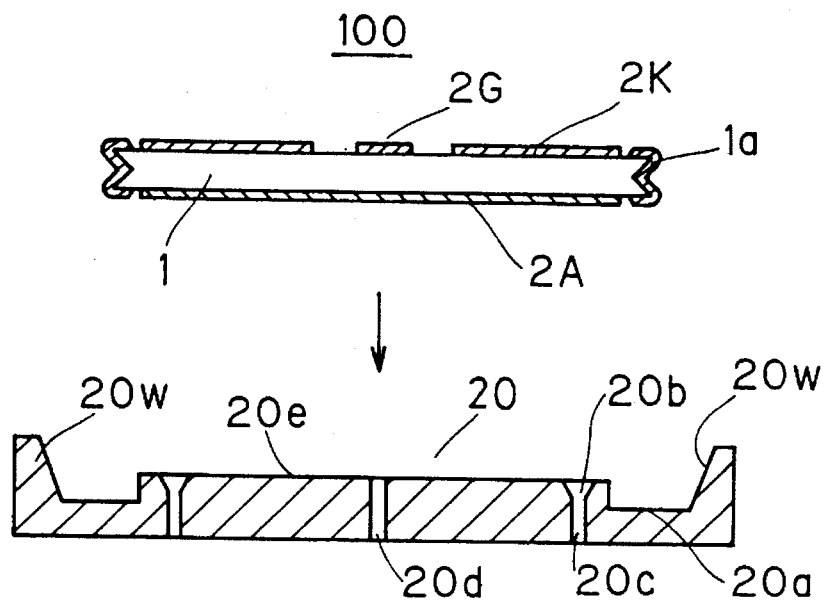
FIG. 3 is a step diagram showing a method of fabricating the pressure-connection type semiconductor device according to the first embodiment of the present invention.

In the step shown in FIG. 3, the semiconductor substrate 1 provided with a semiconductor multilayer structure corresponding to a GTO is prepared. The anode layer 2A, the gate electrode layer 2G and the cathode layer 2K are formed on the lower major surface of the substrate 1, the central portion of the upper major surface and its peripheral region by depositing Al respectively, while the outer peripheral edge of the substrate 1 is cut by bevelling. A shredded layer following such bevelling is removed by silicon etching, so that the polyimide varnish 1a which is an insulating material is applied to the outer peripheral edge. Thus, the semiconductor base substrate 100 is obtained.

On the other hand, a forming jig 20 is prepared to be employed for forming the insulating/holding material 40 (see FIG. 2) on the peripheral edge portion of the semiconductor base substrate 100. This forming jig 20 is obtained by coating the overall surface of a substantially discoidal metal block, such as an aluminum block, for example, preferably with tetrafluororesin, more preferably with PTFE (polytetrafluoroethylene), in a thickness of about 30 μm.

The forming jig 20 has a diameter which is larger than that of the semiconductor base substrate 100. In sectional configuration, this forming jig 20 has a ring-shaped forming groove 20a in its outer peripheral portion, and an outer groove side surface 20w of a pair of groove side surfaces defining the forming groove 20a is inwardly tapered to open toward an opening portion of the forming groove 20a.

The forming groove 20a defines an outer diameter of a base substrate table 20e for receiving the semiconductor base substrate 100, in the interior of a region enclosed with the forming groove 20a. The width of the forming groove 20a is so decided that the outer diameter of the base substrate table 20e coincides with that of the ring-shaped first step 31c provided on the first thermal compensator 31. The outer diameter of the first step 31c is larger than that of the contact surface CS (see FIG. 2) between the semiconductor base substrate 100 and the thermal compensator 31 as understood from FIG. 2, whereby the outer diameter of the base substrate table 20e is also larger than that of the contact surface CS.

A plurality of resin collecting grooves 20b having V-shaped sections are formed in a surface of the base substrate table 20e of the forming jig 20 in positions slightly inside the forming groove 20a. The resin collecting grooves 20b are in circular plane arrangement about the center of the base substrate table 20e. These resin collecting grooves 20b are provided to be slightly closer to the outer periphery as compared with the second step 31a shown in FIG. 2.

Through holes 20c are formed to extend from bottom surfaces of the resin collecting grooves 20 in a direction perpendicular to the major surface of the forming jig 20. The resin collecting grooves 20b are 0.5 to 1.0 mm in width and 0.5 to 1.0 mm in depth, for example, while the through holes 20c are 0.7 to 1.0 mm in diameter. A through hole 20d which is similar in diameter to the through holes 20c is formed in the central portion of the forming jig 20. In other words, a plurality of through holes 20c and 20d are formed in this embodiment, to partially extend from the bottom surfaces of the resin collecting grooves 20b. When the central through hole 20d is omitted, all of the plurality of through holes 20c extend from the bottom surfaces of the resin collecting grooves 20b. The resin collecting grooves 20b may have rectangular or U-shaped sections.

Figure 4:
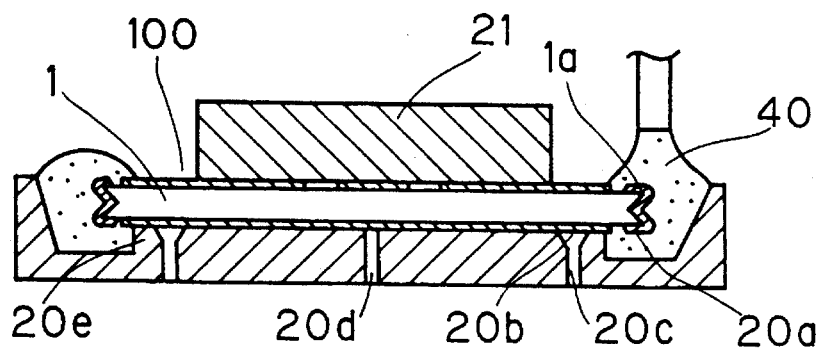
FIG. 4 step diagram showing the method of fabricating the pressure-connection type semiconductor device according to the first embodiment of the present invention.

In the step shown in FIG. 4, the semiconductor base substrate 100 is placed on the forming jig 20 to downwardly direct the surface which is provided with the cathode layer 2K, so that central axes thereof coincide with each other. Further, a weight 21 is placed on the semiconductor base substrate 100, which is placed on the upper major surface of the forming jig 20, in order to prevent misregistration of the semiconductor base substrate 100.

The semiconductor base substrate 100 as well as the forming jig 20 are rotated to fill up viscose liquid resin (hereinafter referred to as "viscose resin"; a silicone rubber material which is not yet heated/hardened in this embodiment), for forming the insulating/holding material 40 from above the polyimide varnish 1a covering the outer peripheral edge of the semiconductor base substrate 100. The viscose resin is filled up in a region which is defined between the outer wall of the forming jig 20, the forming groove 20a and the outer peripheral edge of the semiconductor base substrate 100, and remains to be piled up on the polyimide varnish 1a covering the outer peripheral edge.

In this step, part of the viscose resin penetrating into a small clearance between the cathode layer 2K which is provided on the lower major surface of the semiconductor substrate 1 and the base substrate table 20e by a capillary phenomenon flows into the resin collecting grooves 20b which are formed in the surface of the base substrate table 20e, and is vertically discharged toward the lower major surface of the forming jig 20 through the plurality of through holes 20c provided in the resin collecting grooves 20b when the same is in a large volume. Thus, the viscose resin is prevented from penetrating into a portion inside the resin collecting grooves 20b along the radial direction.

Then, the forming jig 20 which is completely filled up with the viscose resin is inserted in a vacuum vessel (not shown) with the weight 21 being placed on the semiconductor base substrate 100, and subjected to the so-called defoaming for removing bubbles generated from the viscose resin under vacuum. At this time, air or gas which is generated from the viscose resin and remains in the clearance between the semiconductor base substrate 100 and the base substrate table 20e is discharged through the through holes 20c and 20d, whereby it is possible to prevent the semiconductor base substrate 100 from deflection caused by a pressure difference or the like in the vacuum.

Then, the forming jig 20 as completely defoamed is placed in a high-temperature atmosphere, so that the viscose resin is heated/hardened. While this step is generally carried out in a high-temperature nitrogen atmosphere, for example, the viscose resin which is hardened at the room temperature is left in the atmospheric air for a long time to be hardened after defoaming. Thus, the viscose resin is hardened to form the insulating/holding material 40.

Figure 5:
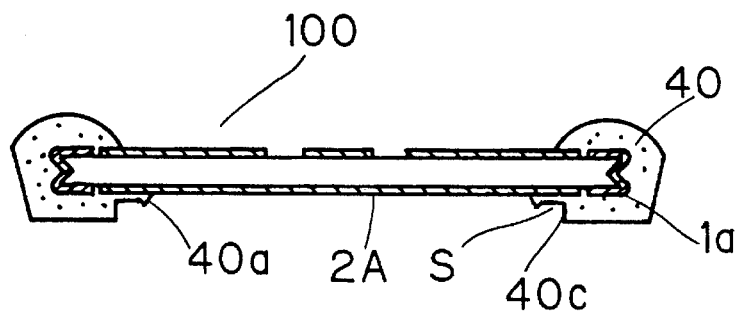
FIG. 5 is a step diagram showing the method of fabricating the pressure-connection semiconductor device according to the first embodiment of the present invention.

Then, the weight 21 is removed from the semiconductor base substrate 100, which in turn is separated from the forming jig 20. Thus, the semiconductor base substrate 100 whose outer peripheral edge is covered with the insulating/holding material 40 is obtained as shown in FIG. 5. The forming jig 20, which is coated with PTFE on its surface, has excellent releasability with respect to the insulating/holding material 40, whereby the insulating/holding material 40 can be separated from the forming jig 20 with no damage.

Referring to FIG. 5, the insulating/holding material 40 which is formed by the forming jig 20 has such a sectional shape that a portion above the polyimide varnish 1a covering its outer peripheral edge is loosely piled up, a portion having been in contact with the forming groove 20a of the forming jig 20 is planarly shaped in reflection of its shape, and the step portion S having the vertical side wall 40c is formed in coincidence with the diameter of the base substrate table 20e of the forming jig 20. The step portion S encloses a lower space of the semiconductor base substrate 100 in the form of a ring, with a diameter coinciding with that of the ring-shaped first step 31c of the thermal compensator 31. On the surface of the anode layer 2A provided on the lower major surface of the semiconductor substrate 1, part of the insulating/holding material 40 penetrating into a small clearance between the anode layer 2A and the base substrate table 20e in the step of filling up the insulating/holding material 40 remains as the flash 40a. Presence of this flash 40a is limited in a range between the outer peripheral edge of the base substrate table 20e which is provided on the forming jig 20 and the resin collecting grooves 20b.

Figure 6:
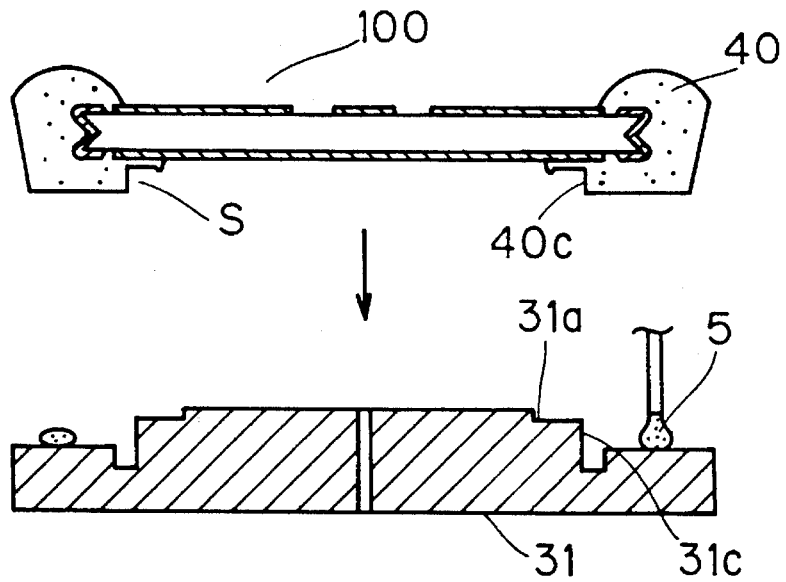
FIG. 6 is a step diagram showing the method of fabricating the pressure-connection type semiconductor device according to the first embodiment of the present invention.

In the step shown in FIG. 6, the semiconductor base substrate 100 whose outer peripheral edge is covered with the insulating/holding material 40 is fixed to the first thermal compensator 31. As to the procedure of this fixation, the bonding insulating/holding material 5 which is not yet hardened is first applied to the overall bottom surface of the first step 31c of the first thermal compensator 31. The bonding insulating/holding material 5 is preferably prepared from the same material as the insulating/holding material 40, i.e., silicone resin in this embodiment. The amount of application is so set that the bonding insulating/holding material 5 has a diameter of 0.7 to 1.0 mm in the applied state if the same has a circular sectional shape.

Then, the semiconductor base substrate 100 whose outer peripheral edge is covered with the insulating/holding material 40 is moved to a portion above the first thermal compensator 31, to be placed thereon. At this time, the vertical wall 40c of the step portion S of the insulating/holding material 40 is engaged with the second step 31a of the first thermal compensator 31. The diameter of the region enclosed with the ring-shaped step portion S coincides with that of the outer peripheral edge of the second step 31a of the first compensator 31 as hereinabove described, whereby the central axes of the thermal compensator 31 and the semiconductor base substrate 100 coincide with each other upon engagement of the vertical wall 40c with the second step 31a of the first thermal compensator 31, to facilitate easy registration of the thermal compensator 31 and the semiconductor base substrate 100.

Figure 7:
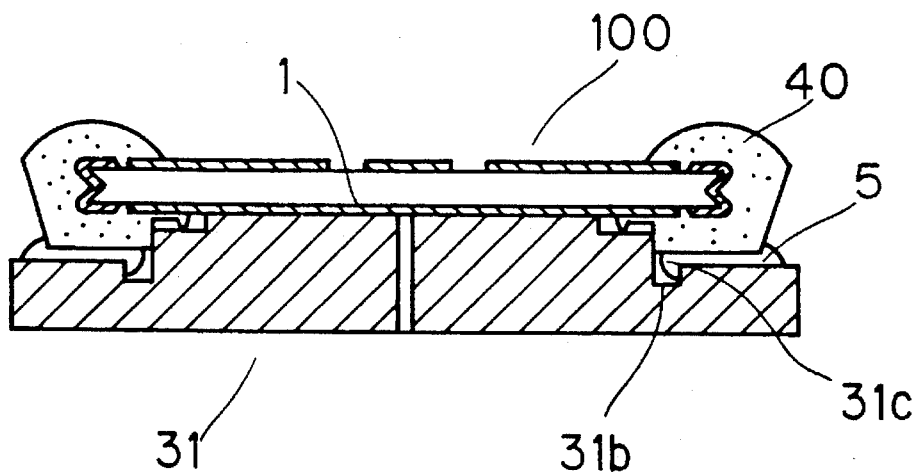
FIG. 7 is a step diagram showing the method of fabricating the pressure-connection type semiconductor device according to the first embodiment of the present invention.

In the step shown in FIG. 7, the semiconductor base substrate 100 is brought into pressure contact with the first thermal compensator 31 for crushing the bonding insulating/holding material 5 to some extent and spreading the same along the overall bottom surface of the first step 31c, thereby improving adhesion between the semiconductor base substrate 100 and the thermal compensator 31. At this time, part of the crushed bonding insulating/holding material 5 flowing toward the exterior and the interior of the insulating/holding material 40 through a junction plane between the insulating/ holding material 40 and the first thermal compensator 31 flows into the corner groove 31b provided in the central corner of the first step 31c, and is prevented from further penetration along the radial direction of the first thermal compensator 31. No particular problem is caused when the bonding insulating/holding material 5 flows out toward the exterior of the insulating/holding material 40.

Thereafter the semiconductor base substrate 100 and the thermal compensator 31 are completely fixed (in more concrete terms, bonded) to each other through steps similar to those for forming the insulating holding material 40, such as defoaming in a vacuum and hardening in a high-temperature atmosphere.

After the semiconductor base substrate 100 and the first thermal compensator 31 are completely fixed to each other, the first thermal compensator 6 and the anode copper block 7 are mounted while the gate electrode 12, the L-shaped lead wire 10, the gate electrode holder 11, the spring 13 and an external gate terminal 18 are mounted on the gate electrode layer 2G with the casing 9, thereby completing the pressure-connection type semiconductor device shown in FIG. 1.

According to this method, formation and hardening of the insulating/holding material 40 can be completed before fixing the semiconductor base substrate 100 to the thermal compensator 31, whereby it is possible to readily and reliably obtain the structure of the pressure-compression type semiconductor device shown in FIG. 1.

<B. Second Embodiment>

Figure 8:
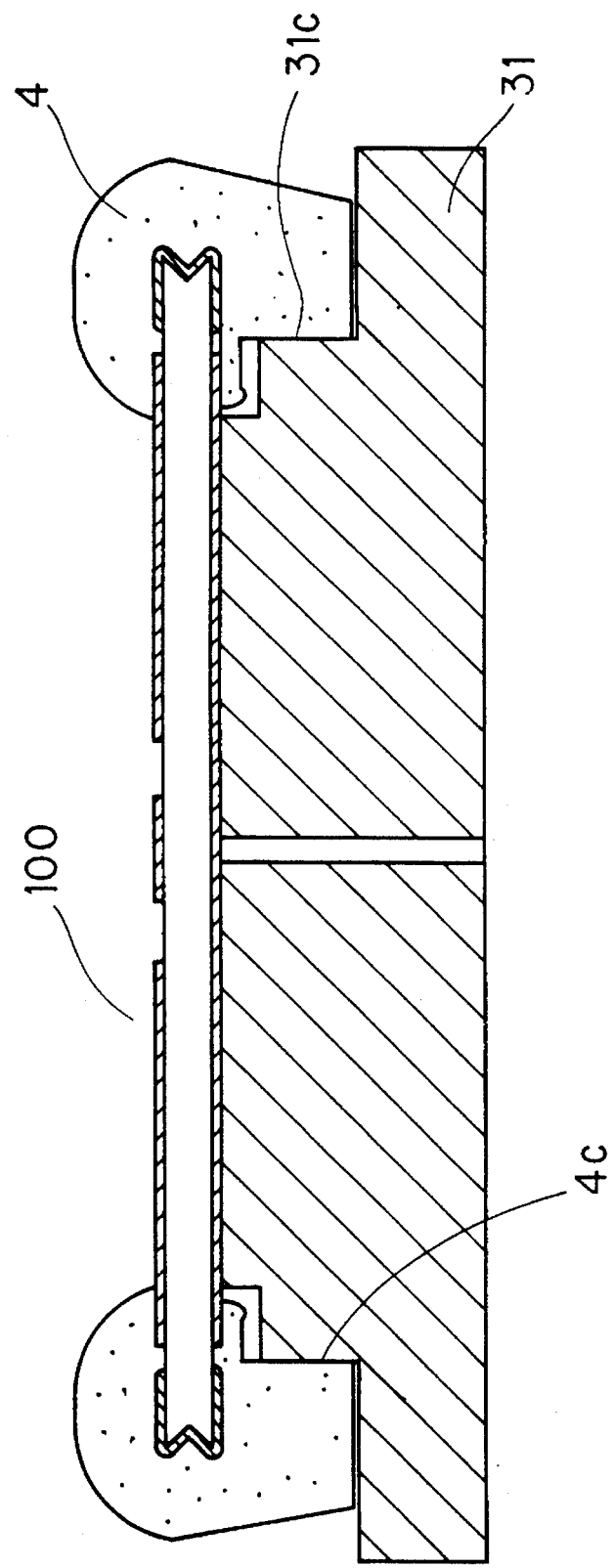
FIG. 8 is a partially enlarged view showing a pressure-connection type semiconductor device according to a second embodiment of the present invention.

FIG. 8 is a partially enlarged view showing a pressure-compression type semiconductor device according to a second embodiment of the present invention. This embodiment is identical in structure to the first embodiment, except portions shown in FIG. 8. In a step of fixing a semiconductor base substrate 100 whose outer peripheral edge is covered with an insulating/holding material 40 to a first thermal compensator 31, no bonding insulating/holding material 5 is applied to the bottom surface of a first step 31c of the first thermal compensator 31 but a vertical wall 40c of a step portion S of the insulating/holding material 40 is simply engaged with a second step 31a of the first thermal compensator 31 in this embodiment. When horizontal tolerance of the vertical wall 40c in FIG. 8 is maintained at about ±0.5 mm, for example, and outer-diametral tolerance of the first step 31c of the first compensator 31 is set in consideration of the horizontal tolerance of the vertical wall 40c, the step portion S is reliably engaged with the second step 31a of the first thermal compensator 31 so that the semiconductor base substrate 100 is fixed to the first thermal compensator 31 with no employment of the bonding insulating/holding material 5. When the insulating/holding material 40 is prepared from silicone rubber having elasticity after hardening or the like, the outer-diametral tolerance of the first step 31c of the first thermal compensator 31 is decided in consideration of its expandability.

Following omission of the bonding insulating/holding material 5 shown in FIG. 2, it is not necessary to form the corner groove 31b. In the embodiment shown in FIG. 8, it is preferable to increase the thickness of the insulating/ holding material 40 by a value corresponding to that of the bonding insulating/holding material 5. This can be readily attained by slightly increasing the depth of the forming groove 20a in the forming jig 20 shown in FIG. 3.

According to this embodiment, no bonding insulating/ holding member 5 is employed for fixing the semiconductor 100 to the first thermal compensator 31, and hence it is possible to omit the step of applying the bonding insulating/ holding material 5 to the first thermal compensator 31, thereby improving the manufacturing efficiency for the pressure-compression type semiconductor device and reducing the manufacturing cost. Further, it is not necessary to provide the corner groove 31b for preventing penetration of the bonding insulating/holding material 5 in the central corner of the first step 31c of the first thermal compensator 31, whereby the manufacturing cost for the first thermal compensator 31 can be reduced.

<C. Third Embodiment>

It is possible to attain excellent releasability of the insulating/holding material 40 with respect to the forming jig 20, by preparing the overall forming jig 20 from PTFE resin, in place of coating the surface of the discoidal metal forming jig 20 with PTFE.

<D. Fourth Embodiment>

It is also possible to attain excellent releasability of the insulating/holding material 40 with respect to the forming jig 20, by coating the surface of the discoidal metal forming jig 20 with PFA (perfluoroalkoxy) resin, in place of PTFE.

While the invention has been shown and described in detail, the foregoing description is in all aspects illustrative and not restrictive. It is therefore understood that numerous modifications and variations can be devised without departing from the scope of the invention.

What is claimed is:

1. A pressure-connection type semiconductor device comprising:

a semiconductor base substrate having at least P-N junction;

a thermal compensator which contacts said semiconductor base substrate, said thermal compensator having a larger diameter than said semiconductor base substrate in an alloy-free state, a first step portion separated from said semiconductor base substrate along a periphery of said thermal compensator, and a corner groove formed in an inner corner of said first step portion along said periphery of said thermal compensator;

an insulating/holding material which covers an outer peripheral portion of said semiconductor base substrate, said insulating/holding material being formed exterior to areas where said semiconductor base substrate contacts said thermal compensator; and a bonding layer formed on said first step portion of said thermal compensator, for bonding said insulating/holding material to said thermal compensator, said corner groove storing any overflowing portion of said bonding layer.

2. A pressure-connection type semiconductor device in accordance with claim 1, wherein a second step portion defining an outer periphery of said contact surface is formed inside said first step portion of said thermal compensator.

* * * * *